United States Patent
Zhang et al.

(10) Patent No.: US 10,749,016 B2
(45) Date of Patent: Aug. 18, 2020

(54) PREPARATION METHOD FOR FULLY TRANSPARENT THIN FILM TRANSISTOR

(71) Applicant: INSTITUTE OF PHYSICS, CHINESE ACADEMY OF SCIENCES, Beijing (CN)

(72) Inventors: Yonghui Zhang, Beijing (CN); Zengxia Mei, Beijing (CN); Huili Liang, Beijing (CN); Xiaolong Du, Beijing (CN)

(73) Assignee: INSTITUTE OF PHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/471,391

(22) PCT Filed: Mar. 23, 2017

(86) PCT No.: PCT/CN2017/077818
§ 371 (c)(1),
(2) Date: Jun. 19, 2019

(87) PCT Pub. No.: WO2018/133195
PCT Pub. Date: Jul. 26, 2018

(65) Prior Publication Data
US 2019/0334018 A1    Oct. 31, 2019

(30) Foreign Application Priority Data

Jan. 20, 2017   (CN) .......................... 2017 1 0040513

(51) Int. Cl.
*H01L 29/66*    (2006.01)
*H01L 21/02*    (2006.01)
(Continued)

(52) U.S. Cl.
CPC .... *H01L 29/66969* (2013.01); *H01L 21/0274* (2013.01); *H01L 21/02178* (2013.01);
(Continued)

(58) Field of Classification Search
CPC ......... H01L 21/02178; H01L 21/02181; H01L 29/4908; H01L 21/0274; H01L 27/1288; H01L 27/1225; H01L 29/7869
See application file for complete search history.

(56) References Cited

U.S. PATENT DOCUMENTS 5,010,027 A * 4/1991 Possin ................. H01L 21/0274
                                                       257/346
5,391,507 A    2/1995 Kwasnick et al.
(Continued)

FOREIGN PATENT DOCUMENTS

CN          1372336         10/2002
CN        101183667          5/2008
(Continued)

OTHER PUBLICATIONS

Search Report in corresponding Chinese Patent Application No. 2017100405139 dated Nov. 13, 2019, 2 pages.
(Continued)

*Primary Examiner* — Changhyun Yi
(74) *Attorney, Agent, or Firm* — Knobbe, Martens, Olson, Bear & LLP (57) ABSTRACT

The present invention provides a preparation method for a fully-transparent thin film transistor, wherein a transparent conductive gate electrode layer of the fully-transparent thin film transistor is used as a photolithographic mask, a photoresist is exposed through a rear surface of a transparent substrate, the transparent substrate has a transmittance higher than 60% to an exposure light beam, and the transparent conductive gate electrode layer has a transmittance
(Continued)

lower than 5% to the exposure light beam. In the preparation method for a fully-transparent thin film transistor provided by the present invention, by using a self-aligned technology, the process complexity and the feature size of the device can both be reduced.

18 Claims, 6 Drawing Sheets

(51) Int. Cl.
    *H01L 21/027*     (2006.01)
    *H01L 21/445*     (2006.01)
    *H01L 29/22*     (2006.01)
    *H01L 29/24*     (2006.01)
    *H01L 29/423*     (2006.01)
    *H01L 29/45*     (2006.01)
    *H01L 29/49*     (2006.01)
    *H01L 29/786*     (2006.01)

(52) U.S. Cl.
    CPC .. *H01L 21/02181* (2013.01); *H01L 21/02189* (2013.01); *H01L 21/02282* (2013.01); *H01L 21/02565* (2013.01); *H01L 21/02623* (2013.01); *H01L 21/445* (2013.01); *H01L 29/24* (2013.01); *H01L 29/42364* (2013.01); *H01L 29/42376* (2013.01); *H01L 29/42384* (2013.01); *H01L 29/45* (2013.01); *H01L 29/4908* (2013.01); *H01L 29/7869* (2013.01); *H01L 29/78603* (2013.01); *H01L 29/78696* (2013.01)

(56) References Cited

U.S. PATENT DOCUMENTS

| | | | |
|---|---|---|---|
| 5,989,944 A | | 11/1999 | Yoon |
| 8,221,964 B2 | * | 7/2012 | Irving ................. H01L 27/1214 430/325 |
| 2009/0130600 A1 | * | 5/2009 | Irving ................... G03F 7/2022 430/312 |
| 2016/0233338 A1 | * | 8/2016 | Lu ....................... H01L 29/7869 |

FOREIGN PATENT DOCUMENTS

| | | |
|---|---|---|
| CN | 101488459 A | 7/2009 |
| CN | 103346093 A | 10/2013 |

OTHER PUBLICATIONS

Search Report in corresponding Chinese Patent Application No. 2017100405139 dated Jan. 16, 2020, 2 pages.
International Search Report of corresponding PCT Application PCT/CN2017/077818—4 pages (dated May 10, 2017).

* cited by examiner

PREPARATION METHOD FOR FULLY TRANSPARENT THIN FILM TRANSISTOR

TECHNICAL FIELD

The present invention belongs to the field of transparent electronic devices, and particularly relates to a preparation method for a fully-transparent thin film transistor, in particular to a preparation method for a fully-transparent flexible thin film transistor.

BACKGROUND OF THE PRESENT INVENTION

As an important switching element, thin film transistors are one of the most widely used devices in driving circuits. With the continuous development of science and technology, the requirements for flexibility and transparency of the thin film transistors are increasing. At present, the thin film transistors are mainly prepared by conventional photolithography, printing or other technologies, which usually requires multiple alignment operations between patterns of multiple sets of masks or multiple concave/convex plates, and thus undoubtedly increases the complexity of preparation and reduces the precision of preparation. Therefore, researchers have proposed a self-aligned technology at the expense of a reduction in the transparency of devices, that is, a non-transparent gate (e.g., metal or polycrystalline silicon) is used as a photolithographic mask (referring to MUNZENRIEDER N, PETTI L, ZYSSET C et al., Flexible Self-Aligned Amorphous InGaZnO Thin-Film Transistors With Submicrometer Channel Length and a Transit Frequency of 135 MHz [J]. IEEE Transactions on Electron Devices, 2013, 60(9); 2815-2820.), and a back-face exposure method is adopted for obtaining patterns of the source and drain. However, although this technology reduces one procedure for pattern alignment and saves one set of masks or concave/convex plates, the full transparency of electronic devices cannot be realized for the use of the non-transparent gate, and the current requirements for fully-transparent electronic devices cannot be satisfied. As will be understood by those skilled in the art, "fully-transparent" means that the electronic devices and the circuits have a transmittance of more than 80% over the whole visible light range (400 nm to 790 nm).

In addition, flexible thin film transistors fabricated by roll-to-roll printing or other technologies exhibit excellent device performances. So far, many flexible devices having a mobility higher than 30 $cm^2/Vs$ and a subthreshold swing less than 100 mV/dec have been reported. However, since polymer substrates are easy to deform, flexible transistor devices fabricated by roll-to-roll printing technologies have a feature size greater than 100 which is much larger than 14 nm achievable on silicon-based devices by the conventional photolithography. This will severely influence the circuit integration and the maximum operating frequency, and greatly hinder the application of flexible electronic devices in the field of integrated circuits and the high frequency field.

Also, in the prior art, the thin film transistors are usually fabricated into thin film transistor arrays. In order to realize the separation of electrodes of different thin film transistors, an additional patterning process is usually required to separate adjacent thin film transistors.

SUMMARY OF THE PRESENT INVENTION

Hence, an objective of the present invention is to overcome the above deficiencies of the prior art and provide a preparation method for a fully-transparent thin film transistor, wherein a transparent conductive gate electrode layer of the fully-transparent thin film transistor is used as a photolithographic mask, a photoresist is exposed through a rear surface of a transparent substrate, the transparent substrate has a transmittance higher than 60% to an exposure light beam, and the transparent conductive gate electrode layer has a transmittance lower than 5% to the exposure light beam.

In accordance with the preparation method of the present invention, preferably, the preparation method comprises:

step 1: preparing the transparent conductive gate electrode layer on the transparent substrate;

step 2: successively preparing an insulating layer and a channel layer on the transparent conductive gate electrode layer;

step 3: preparing the photoresist on a sample obtained in the step 2;

step 4: exposing and patterning the photoresist through the rear surface of the transparent substrate;

step 5: preparing a transparent conductive layer on a sample obtained in the step 4; and step 6: removing the photoresist and the transparent conductive layer on the photoresist.

In accordance with the preparation method of the present invention, preferably, the preparation method comprises:

step 1: preparing the transparent conductive gate electrode layer on the transparent substrate;

step 2: preparing an insulating layer on the transparent conductive gate electrode layer;

step 3: preparing the photoresist on a sample obtained in the step 2;

step 4: exposing and patterning the photoresist through the rear surface of the transparent substrate;

step 5: preparing a transparent conductive layer on a sample obtained in the step 4;

step 6: removing the photoresist and the transparent conductive layer on the photoresist; and step 7: preparing a channel layer on a sample obtained in the step 6.

In accordance with the preparation method of the present invention, preferably, in the step 1, the transparent conductive gate electrode layer is of an "8"-like shape.

In accordance with the preparation method of the present invention, preferably, the channel layer is located on a region corresponding to a middle portion of the transparent conductive gate electrode layer.

In accordance with the preparation method of the present invention, preferably, the transparent substrate is made of PDMS, PMMA, PET, PVC or PC.

In accordance with the preparation method of the present invention, preferably, the transparent conductive gate electrode layer, the insulating layer, the channel layer, the photoresist and the conductive layer are prepared by a roll-to-roll printing method.

In accordance with the preparation method of the present invention, preferably, the gate electrode layer is made of ITO, AZO, GZO or FTO.

In accordance with the preparation method of the present invention, preferably, the exposure light beam has a wavelength of 200 nm to 350 nm.

In accordance with the preparation method of the present invention, preferably, the exposure light beam is an ultraviolet light of 254 nm or an ultraviolet light of 248 nm.

In addition, the present invention further provides a fully-transparent thin film transistor prepared by the preparation method according to the present invention.

In the preparation method for a fully-transparent thin film transistor provided by the present invention, no additional masks or concave/convex plates are required, no alignment operation is performed, and the matching of source and drain electrode with the gate electrode is realized by a self-aligned technology. Consequently, the process complexity and the feature size of the device can both be reduced. In addition, the present invention combines the self-aligned technology with the roll-to-roll printing technology, which is beneficial to the application of fully-transparent flexible devices in the fields with high integration and high frequency.

BRIEF DESCRIPTION OF THE DRAWINGS

The embodiments of the present invention will be further described below with reference to the accompanying drawings, in which.

DETAILED DESCRIPTION OF THE PRESENT INVENTION

In order to make the objectives, technical solutions and advantages of the present invention more clear, the present invention will be further described below in detail by way of specific embodiments with reference to the accompanying drawings.

Embodiment 1

Figure 1:
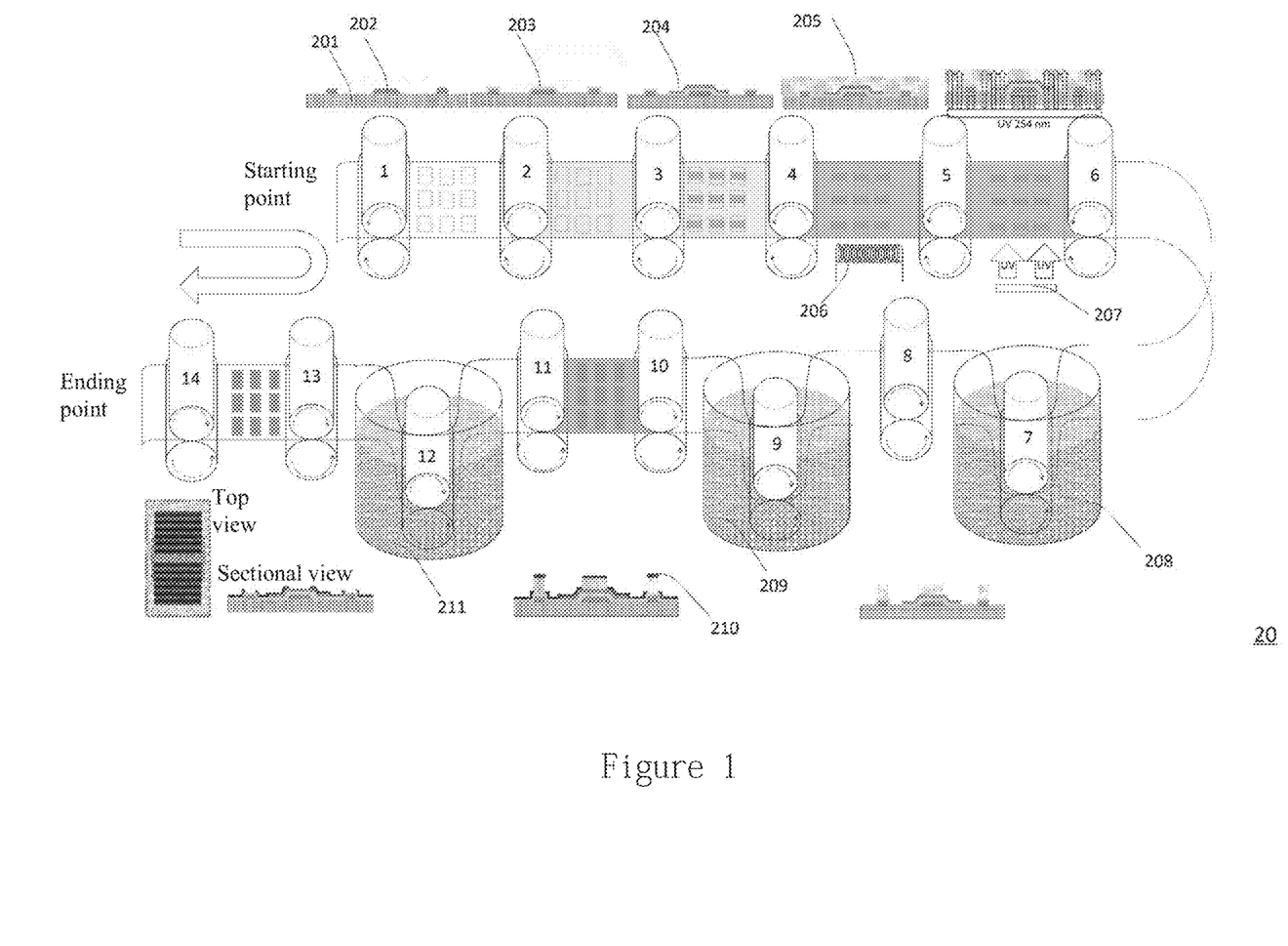
FIG. 1 is a schematic flowchart of preparing a fully-transparent flexible thin film transistor according to Embodiment 1 of the present invention.

This embodiment provides a preparation method for a fully-transparent flexible thin film transistor. Referring to FIG. 1, shown is a schematic flowchart of preparing a fully-transparent flexible thin film transistor according to Embodiment 1 of the present invention, including the following steps:

Step 1: An ITO (indium tin oxide) transparent electrode 202 having a thickness of 150 nm is coated on a cleaned PDMS (polydimethylsiloxane) substrate 201 by a 1# roller with a pattern of an "8"-like shape.

Step 2: An $Al_2O_3$ (aluminum oxide) insulating layer 203 having a thickness of 50 nm is coated by a 2# roller.

Step 3: A ZnO (zinc oxide) channel layer 204 having a thickness of 20 nm is coated by a 3# roller. The 3# roller has a pattern matched with the pattern of the "8"-like shape, so that the channel layer is coated only within a region corresponding to a middle portion of the ITO transparent electrode with the pattern of the "8"-like shape.

Step 4: S1813 positive photoresist 205 having a thickness of 1.3 μm is coated by a 4# roller, and the coated photoresist is prebaked between the 4# and 5# rollers by an oven 206 at 115° C. for 70 seconds.

Figure 2:
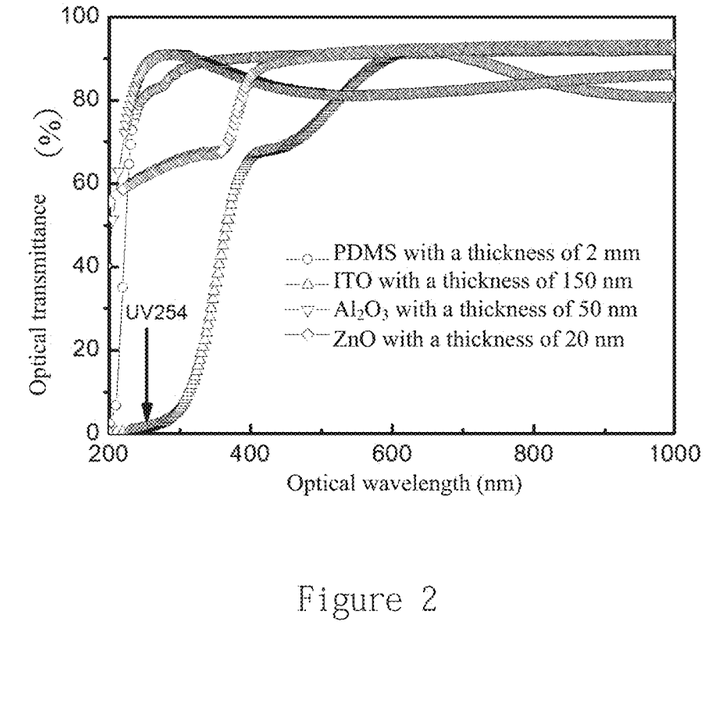
FIG. 2 is an optical transmittance spectrogram of each material layer in the fully-transparent flexible thin film transistor prepared according to Embodiment 1 of the present invention.

Step 5: The rear surface is exposed between the 5# and 6# rollers for 10 seconds by a 254 nm ultraviolet light source 207 with a light intensity of 10 mW/cm$^2$. With reference to the optical transmittance spectrogram of each material layer according to this embodiment in FIG. 2, it can be known that the PDMS substrate with a thickness of 2 mm, the $Al_2O_3$ insulating layer with a thickness of 50 nm and the ZnO channel layer with a thickness of 20 nm have a transmittance up to 81.39%, 88.89% and 62.56% for the ultraviolet light of 254 nm, respectively, so that the ultraviolet light can be well transmitted therethrough to irradiate the photoresist thereon; while the ITO gate electrode with a thickness of 150 nm has a transmittance of 1.21% to the ultraviolet light of 254 nm, so that the ultraviolet light is effectively blocked from irradiating the photoresist on the gate electrode. Therefore, only the photoresist in the region on the gate electrode is not irradiated by the ultraviolet light, while the photoresist in other regions is denatured after being irradiated with the ultraviolet light.

Step 6: The exposed photoresist is guided by 7# and 9# rollers to pass through an MF-319 developing solution 208 and a deionized water developing solution 209 and then is washed away.

Step 7: An ITO electrode 210 having a thickness of 100 nm is coated by a 10# roller.

Step 8: A sample obtained in the step 7 is guided by a 12# roller to pass through an acetone stripping solution 211, the excessive photoresist and the ITO electrode thereon are removed to form a source electrode and a drain electrode, and the self-aligned preparation of the fully-transparent thin film transistor is finally realized.

It is to be noted that, in FIG. 1, 8#, 11#, 13# and 14# rollers merely play a transition role in the roll-to-roll printing process, and therefore are unnecessary.

Figure 3:
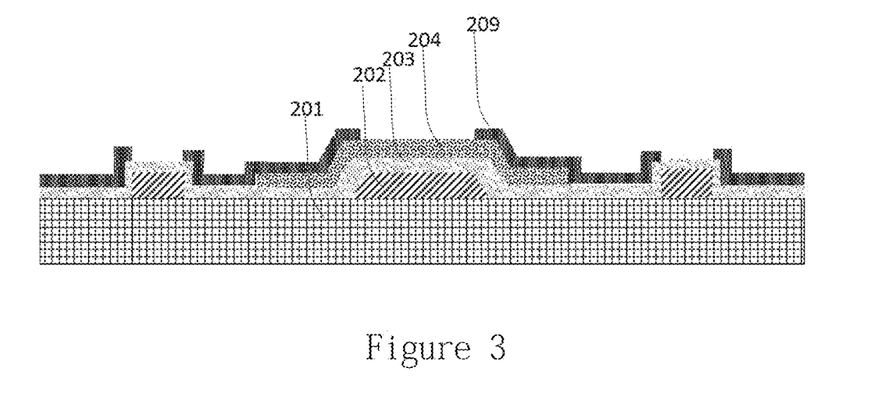
FIG. 3 is an enlarged sectional view of the fully-transparent flexible thin film transistor prepared according to a first embodiment of the present invention.
Figure 4:
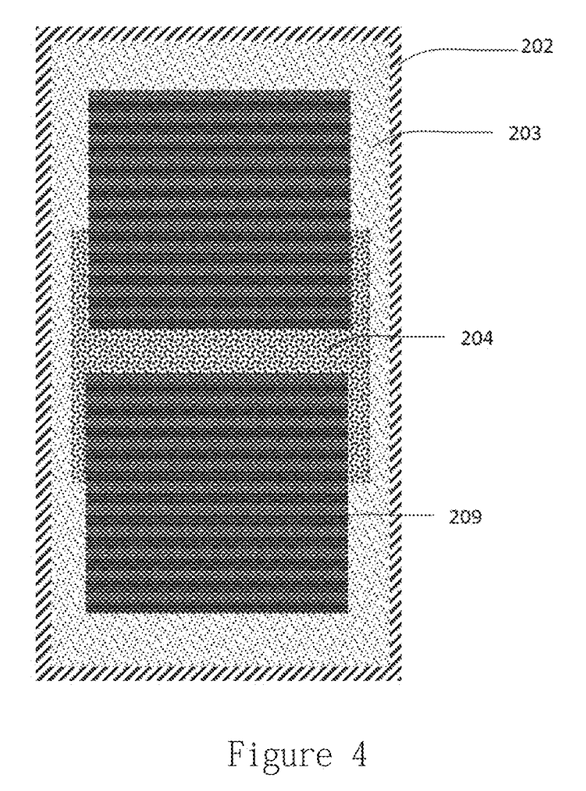
FIG. 4 is an enlarged top view of the fully-transparent flexible thin film transistor prepared according to Embodiment 1 of the present invention.

FIGS. 3 and 4 show an enlarged sectional view and an enlarged top view of the manufactured fully-transparent flexible thin film transistor. The fully-transparent flexible thin film transistor successively includes a PDMS substrate 201, an ITO gate electrode 202, an $Al_2O_3$ insulating layer 203, a ZnO channel layer 204 and an ITO source/drain electrode 209 from the bottom up, which is a typical bottom-gate overlapping thin film transistor structure. It can be clearly seen from FIG. 4 that the gate electrode 202 is of an "8"-like shape, and the channel layer 204 is only coated on a part of the insulating layer corresponding to the middle portion of the "8"-like-shaped gate electrode. After the ultraviolet light passes through the insulating layer 203 and the channel layer 204, the photoresist only in the region that is not coated with the gate electrode 202 is exposed to form the pattern required by the source and drain electrodes 209. In this embodiment, by preparing the "8"-like-shaped gate electrode and patterning the channel layer, the source electrode and the drain electrode of the thin film transistor are located in two rings of the "8"-like-shaped gate electrode, respectively, so that an isolation zone is formed on the periphery of the thin film transistor, thereby avoiding electrical conduction between transistors of a thin film transistor array.

In this embodiment, the selective transmission of each material layer to the exposure light beam is an important prerequisite for the success of the self-aligned technology.

Figure 5:
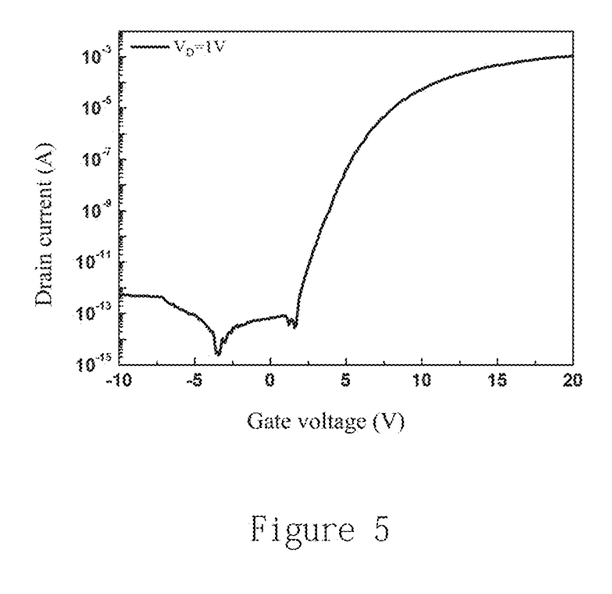
FIG. 5 is a graph showing transfer characteristics of the fully-transparent flexible thin film transistor prepared according to Embodiment 1 of the present invention.
Figure 6:
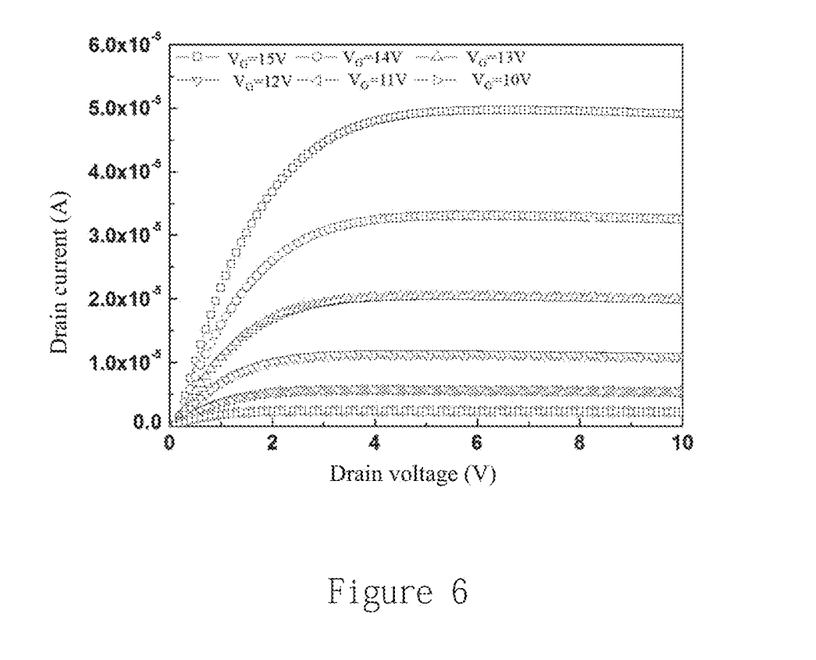
FIG. 6 is a graph showing output characteristics for different gate voltages of the fully-transparent flexible thin film transistor prepared according to Embodiment 1 of the present invention.

FIG. 5 is a graph showing transfer characteristics of the fully-transparent flexible thin film transistor prepared in this embodiment. The drain voltage is set as 1 V, and the gate voltage is scanned from −10 V to 20 V. Thus, the following performances of the transistor can be obtained: an on-off ratio of $5 \times 10^9$, a mobility of 5 $cm^2/Vs$, a subthreshold swing of 0.4 V/dec, and a cut-in voltage of 2 V. It is indicated that the fully-transparent flexible thin film transistor prepared in this embodiment has excellent switching performance. FIG. 6 is a graph showing output characteristics for different gate voltages $V_G$ of the thin film transistor prepared in this embodiment. It can be known from FIG. 6 that the thin film transistor prepared in this embodiment has excellent channel resistance regulation performance.

In addition, this embodiment employs the combination of the roll-to-roll printing technology with the self-aligned technology. Since the gate layer is used as a mask, the feature size (i.e., the distance between source and drain electrodes) of the prepared transistor is similar to the width of the gate. As a result, the size of the device is greatly reduced, and the application of flexible transparent electronic devices in the field of integrated circuits and the high frequency field is greatly expanded.

Embodiment 2

Figure 7:
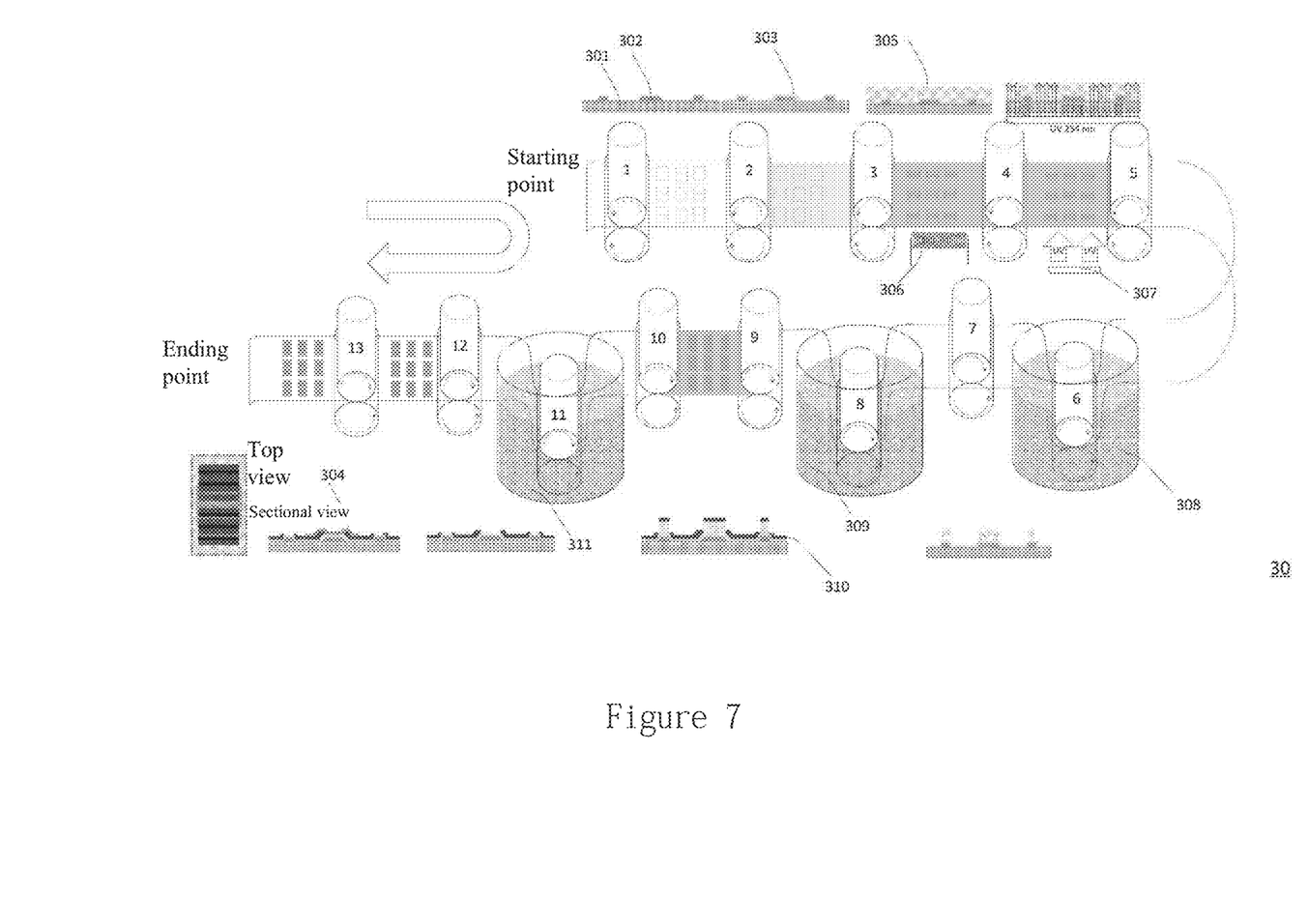
FIG. 7 is a schematic flowchart of preparing a fully-transparent flexible thin film transistor according to Embodiment 2 of the present invention.

This embodiment provides another preparation method for a fully-transparent flexible thin film transistor. As shown in FIG. 7, the preparation process includes the following steps:

Step 1: An AZO (aluminum zinc oxide) transparent electrode 302 having a thickness of 100 nm is coated on a cleaned PDMS substrate 301 by a 1# roller with a pattern of an "8"-like shape.

Step 2: An $HfO_2$ (hafnium oxide) insulating layer 303 having a thickness of 50 nm is coated by a 2# roller.

Step 3: AR-P5350 positive photoresist 305 having a thickness of 1 μm is coated by a 3# roller, and the coated photoresist is prebaked between 3# and 4# rollers by an oven 306 at 90° C. for 300 seconds.

Step 4: The rear surface is exposed between 4# and 5# rollers for 10 seconds by a 254 nm ultraviolet light source 307 with a light intensity of 10 $mW/cm^2$. It can be known from the above analysis that the photoresist in the gate region is not irradiated by the ultraviolet light, while the photoresist in other regions is irradiated by the ultraviolet light and then denatured.

Step 5: The exposed photoresist is guided by 6# and 8# rollers to pass through an AR300-26 developing solution 308 and a deionized water developing solution 309 and then is washed away.

Step 6: An AZO electrode 310 having a thickness of 100 nm is coated by a 9# roller.

Step 7: A sample obtained in the step 6 is guided by a 11# roller to pass through an acetone stripping solution 311, and the excessive photoresist and the AZO electrode thereon are removed to form a source electrode and a drain electrode.

Step 8: An InGaZnO (indium gallium zinc oxide) channel layer 304 having a thickness of 20 nm is coated by a 13# roller, and the self-alignment of the fully-transparent flexible thin film transistor is finally realized.

Similarly, in FIG. 7, the 7#, 10# and 12# rollers merely play a transition role in the roll-to-roll printing process, and therefore are unnecessary.

Figure 8:
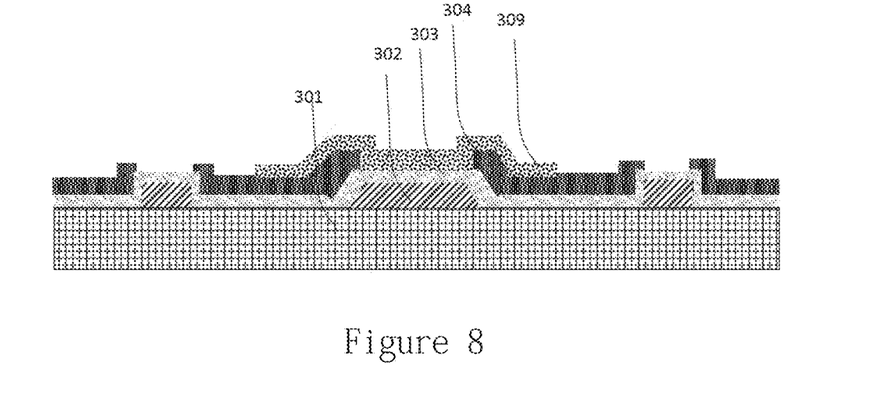
FIG. 8 is an enlarged sectional view of the fully-transparent flexible thin film transistor prepared according to Embodiment 2 of the present invention.

FIG. 8 shows a schematic sectional view of the fully-transparent flexible thin film transistor prepared in this embodiment. The structure prepared in this embodiment is similar to that of the thin film transistor prepared in Embodiment 1, except that the source and drain electrodes 309 are located below the channel layer 304. This structure is called a bottom-gate coplanar thin film transistor structure.

Embodiment 3

Figure 9:
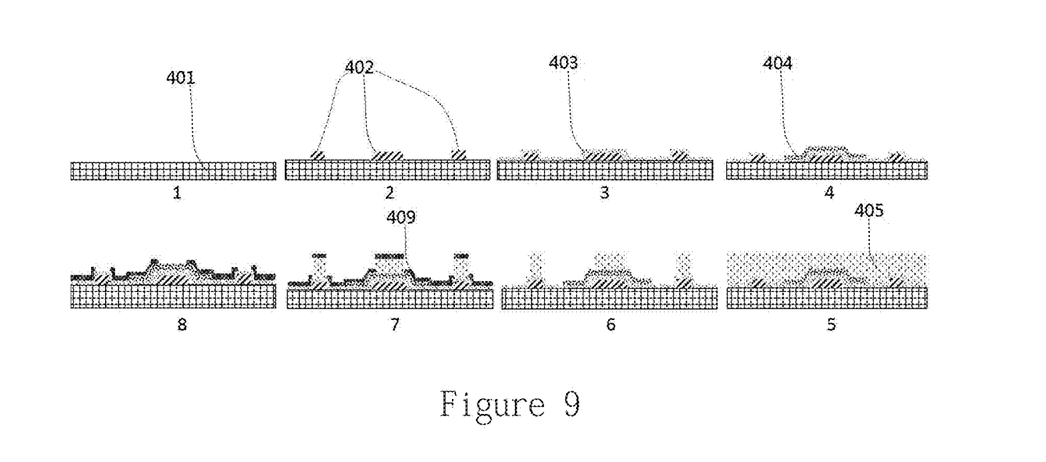
FIG. 9 is a schematic flowchart of preparing a fully-transparent thin film transistor according to Embodiment 3 of the present invention.

This embodiment provides a preparation method for a non-flexible fully-transparent thin film transistor. Referring to FIG. 9, shown is a schematic view of a flow of preparing a fully-transparent thin film transistor according to this embodiment, including the following steps.

Step 1: A non-flexible glass substrate 401 is cleaned.

Step 2: A transparent conductive GZO (gallium zinc oxide) gate electrode 402 is prepared on the glass substrate 401 by magnetron sputtering, and the gate electrode 402 is etched into an "8"-like shape by photolithography.

Step 3: A $ZrO_2$ (zirconium oxide) insulating layer 403 is prepared on the gate electrode 402 by atomic layer deposition.

Step 4: An InZnO (indium zinc oxide) channel layer 404 is prepared on a part of the insulating layer 403 corresponding to a middle portion of the "8"-like-shaped gate electrode by magnetron sputtering.

Step 5: A photoresist layer 405 is coated on a sample obtained in the step 4 and then is prebaked.

Step 6: A sample obtained in the step 5 is irradiated and exposed by a 248 nm ultraviolet light passing through the rear surface of the substrate, and experiences developing and fixing steps, so as to obtain openings required by the source electrode and the drain electrode.

Step 7: A GZO transparent electrode is prepared on a sample obtained in the step 6 by magnetron sputtering.

Step 8: A sample obtained in the step 7 is soaked in an acetone solution to remove the photoresist and the transparent electrode on the photoresist, so as to obtain source and drain electrodes 409 and eventually obtain the fully-transparent thin film transistor.

In this embodiment, the GZO (gallium zinc oxide) gate electrode also acts as a photolithographic mask, and a 248 nm ultraviolet light having a transmittance lower than 5% for the material of the gate electrode and higher than 60% for the materials of the substrate, the insulating layer and the channel layer is used as an exposure light beam, thus realizing the self-aligned preparation of the fully-transparent thin film transistor. In addition, in this embodiment, by the "8"-like shape of the prepared gate electrode and the patterned coating of the channel layer, the source electrode and the drain electrode of the thin film transistor are located in two rings of the "8"-like-shaped gate electrode, respectively, so that an isolation zone is formed on the periphery of the fully-transparent thin film transistor, and the electrical conduction between transistors of a fully-transparent thin film transistor array is prevented.

In accordance with other embodiments of the present invention, the gate electrode of the "8"-like shape is used for isolating individual thin film transistors of the thin film transistor array, including any two adjacent closed loops in the form of "日", "日" or the like. It should be understood by those skilled in the art that the present invention does not necessarily require the use of the "8"-like-shaped gate electrode, and the isolation zone on the periphery of the thin film transistor may be prepared in any way known in the art.

In accordance with other embodiments of the present invention, the preparation method of each functional layer is not limited to the roll-to-roll printing and the magnetron sputtering, and may be any thin film preparation technology known in the art, such as ink-jet printing, spin coating, spray coating, electron beam evaporation, atomic layer deposition and metal-organic chemical vapor deposition.

In accordance with other embodiments of the present invention, the material of the substrate includes, but not limited to, PDMS and glass, and may further include PET (polyethylene terephthalate), PMMA (polymethyl methacrylate), PVC (polyvinyl chloride), PC (polycarbonate) and other transparent materials.

In accordance with other embodiments of the present invention, the material of the gate electrode is not limited to indium tin oxide, aluminum zinc oxide and gallium zinc oxide, and may also be any other transparent conductive material known in the art, for example, fluorine tin oxide (FTO) or the like.

In accordance with other embodiments of the present invention, the material includes, but not limited to, zinc oxide, indium oxide, indium zinc oxide, indium gallium zinc oxide, gallium nitride, silicon carbide, pentacene, rubrene, poly(3-hexylthiophene), graphene, molybdenum disulfide or other semiconductor materials. The material of the insulating layer is not limited to aluminum oxide, hafnium oxide and zirconium oxide, and may also be silicon oxide, silicon nitride, polymethyl methacrylate or other insulating materials.

In accordance with other embodiments of the present invention, the light source used for exposure is not limited to ultraviolet light having a wavelength of 254 nm and 248 nm, and may also be light having other wavelengths as long as the light can effectively transmit through the material of the substrate and can be blocked by the gate electrode. Specifically, in the present invention, it is required that the transmittance of the exposure light beam to the substrate is higher than 60%, and the transmittance of the exposure light beam to the gate layer is lower than 5%. For example, it can be known from FIG. 3 that the light having a wavelength from 200 nm to 350 nm can be used for exposure, so as to realize the self-aligned preparation of the fully-transparent thin film transistor.

In the present invention, the thickness of each functional layer is not limited as long as the thin film is flat and continuous.

In accordance with other embodiments of the present invention, the gate electrode, the source electrode and the drain electrode may be made of the same material or different materials.

Although the present invention has been described by way of preferred embodiments, the present invention is not limited thereto, and various changes and variations can be made without departing from the scope of the present invention.

What is claimed is:

1. A preparation method for a fully-transparent thin film transistor, wherein a transparent conductive gate electrode layer of the fully-transparent thin film transistor is used as a photolithographic mask, a photoresist is exposed through a rear surface of a transparent substrate, the transparent substrate has a transmittance higher than 60% to an exposure light beam, and the transparent conductive gate electrode layer has a transmittance lower than 5% to the exposure light beam.

2. The preparation method according to claim 1, comprising:
   step 1: preparing the transparent conductive gate electrode layer on the transparent substrate;
   step 2: successively preparing an insulating layer and a channel layer on the transparent conductive gate electrode layer;
   step 3: preparing the photoresist on a sample obtained in the step 2;
   step 4: exposing and patterning the photoresist through the rear surface of the transparent substrate;
   step 5: preparing a transparent conductive layer on a sample obtained in the step 4; and
   step 6: removing the photoresist and the transparent conductive layer on the photoresist.

3. The preparation method according to claim 1, comprising:
   step 1: preparing the transparent conductive gate electrode layer on the transparent substrate;
   step 2: preparing an insulating layer on the transparent conductive gate electrode layer;
   step 3: preparing the photoresist on a sample obtained in the step 2;
   step 4: exposing and patterning the photoresist through the rear surface of the transparent substrate;
   step 5: preparing a transparent conductive layer on a sample obtained in the step 4;
   step 6: removing the photoresist and the transparent conductive layer on the photoresist; and
   step 7: preparing a channel layer on a sample obtained in the step 6.

4. The preparation method according to claim 2, wherein, in the step 1, the transparent conductive gate electrode layer is of an "8"-like shape.

5. The preparation method according to claim 4, wherein the channel layer is located on a region corresponding to a middle portion of the transparent conductive gate electrode layer.

6. The preparation method according to claim 2, wherein the transparent substrate is made of PDMS, PMMA, PET, PVC or PC.

7. The preparation method according to claim 6, wherein the transparent conductive gate electrode layer, the insulating layer, the channel layer, the photoresist and the conductive layer are prepared by a roll-to-roll printing method.

8. The preparation method according to claim 2 or 3, wherein the gate electrode layer is made of ITO, AZO, GZO or FTO.

9. The preparation method according to claim 2 or 3, wherein the exposure light beam has a wavelength of 200 nm to 350 nm.

10. The preparation method according to claim 9, wherein the exposure light beam is an ultraviolet light of 254 nm or an ultraviolet light of 248 nm.

11. A fully-transparent thin film transistor prepared by the preparation method according to claim 1.

12. The preparation method according to claim 3, wherein, in the step 1, the transparent conductive gate electrode layer is of an "8"-like shape.

13. The preparation method according to claim 12, wherein the channel layer is located on a region corresponding to a middle portion of the transparent conductive gate electrode layer.

14. The preparation method according to claim 3, wherein the transparent substrate is made of PDMS, PMMA, PET, PVC or PC.

15. The preparation method according to claim 14, wherein the transparent conductive gate electrode layer, the insulating layer, the channel layer, the photoresist and the conductive layer are prepared by a roll-to-roll printing method.

16. The preparation method according to claim 3, wherein the gate electrode layer is made of ITO, AZO, GZO or FTO.

17. The preparation method according to claim 3, wherein the exposure light beam has a wavelength of 200 nm to 350 nm.

18. The preparation method according to claim 17, wherein the exposure light beam is an ultraviolet light of 254 nm or an ultraviolet light of 248 nm.

* * * * *